(12) United States Patent
Peterson et al.

(10) Patent No.: US 10,873,399 B2
(45) Date of Patent: *Dec. 22, 2020

(54) METHOD AND SYSTEM FOR A PHOTONIC INTERPOSER

(71) Applicant: Luxtera LLC., Wilmington, DE (US)

(72) Inventors: Mark Peterson, San Diego, CA (US); Greg Young, Irvine, CA (US); Peter De Dobbelaere, San Diego, CA (US)

(73) Assignee: Luxtera LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/533,541

(22) Filed: Aug. 6, 2019

(65) Prior Publication Data

US 2019/0363797 A1 Nov. 28, 2019

Related U.S. Application Data

(63) Continuation of application No. 16/180,715, filed on Nov. 5, 2018, now Pat. No. 10,374,719, which is a (Continued)

(51) Int. Cl.
*H04B 10/43* (2013.01)
*G02B 6/122* (2006.01)
(Continued)

(52) U.S. Cl.
CPC .......... *H04B 10/43* (2013.01); *G02B 6/1225* (2013.01); *H01L 21/84* (2013.01); (Continued)

(58) Field of Classification Search
CPC ...... H04B 10/43; H04B 10/70; H04B 10/801; G02B 6/1225; G02B 2006/12061;
(Continued)

(56) References Cited

U.S. PATENT DOCUMENTS 6,075,908 A * 6/2000 Paniccia ................. G02F 1/218
359/245
7,162,124 B1 1/2007 Gunn, III et al.
(Continued)

FOREIGN PATENT DOCUMENTS

WO 2004079420 A1 9/2004
WO 2004093354 A1 10/2004

OTHER PUBLICATIONS

European Examination Report for Application No. 16 152 245.3-1220 dated Jun. 5, 2020.

*Primary Examiner* — Dalzid E Singh
(74) *Attorney, Agent, or Firm* — Patterson + Sheridan, LLP

(57) ABSTRACT

Methods and systems for a photonic interposer may include receiving a continuous wave (CW) optical signal in a silicon photonic interposer from an optical source. A modulated optical signal may be generated by processing the received CW optical signal based on a first electrical signal received from an electronics die. A second electrical signal may be generated in the silicon photonic interposer based on the generated modulated optical signal, and may then be communicated to the electronics die via copper pillars. Optical signals may be communicated into and/or out of the silicon photonic interposer utilizing grating couplers. The electronics die may comprise one or more of a processor core, a switch core, memory, or a router.

19 Claims, 12 Drawing Sheets

Related U.S. Application Data continuation of application No. 15/796,063, filed on Oct. 27, 2017, now Pat. No. 10,122,463, which is a continuation of application No. 15/165,677, filed on May 26, 2016, now Pat. No. 9,813,161, which is a continuation of application No. 14/475,484, filed on Sep. 2, 2014, now Pat. No. 9,356,701, which is a continuation of application No. 13/422,776, filed on Mar. 16, 2012, now Pat. No. 8,831,437, which is a continuation-in-part of application No. 12/554,449, filed on Sep. 4, 2009, now Pat. No. 8,877,616.

(60) Provisional application No. 61/191,479, filed on Sep. 8, 2008, provisional application No. 61/199,353, filed on Nov. 14, 2008, provisional application No. 61/516,226, filed on Mar. 30, 2011.

(51) Int. Cl.
*H01L 21/84* (2006.01)
*H01L 23/498* (2006.01)
*H01L 25/16* (2006.01)
*H01L 27/12* (2006.01)
*H04B 10/80* (2013.01)
*H04B 10/70* (2013.01)
*G02B 6/12* (2006.01)

(52) U.S. Cl.
CPC .. *H01L 23/49827* (2013.01); *H01L 23/49838* (2013.01); *H01L 23/49866* (2013.01); *H01L 25/167* (2013.01); *H01L 27/1203* (2013.01); *H04B 10/70* (2013.01); *H04B 10/801* (2013.01); *H05K 999/99* (2013.01); *G02B 2006/12061* (2013.01); *G02B 2006/12142* (2013.01); *H01L 2224/48091* (2013.01); *H01L 2224/73265* (2013.01)

(58) Field of Classification Search
CPC .......... G02B 2006/12142; H01L 21/84; H01L 23/49827; H01L 23/49838; H01L 23/49866; H01L 25/167; H01L 27/1203; H01L 2224/48091; H01L 2224/73265; H05K 999/99
USPC ........................................................ 398/138
See application file for complete search history.

(56) References Cited

U.S. PATENT DOCUMENTS

| | | | |
|---|---|---|---|
| 8,320,767 B2 | 11/2012 | Morris et al. | |
| 8,457,454 B1 | 6/2013 | Roy et al. | |
| 8,546,955 B1 | 10/2013 | Wu | |
| 8,831,437 B2 * | 9/2014 | Dobbelaere | H01L 25/167 398/164 |
| 9,331,096 B2 * | 5/2016 | Pinguet | H01L 21/84 |
| 9,356,701 B2 * | 5/2016 | Peterson | H01L 21/84 |
| 9,391,708 B2 * | 7/2016 | Fincato | H04B 10/801 |
| 9,813,161 B2 * | 11/2017 | Peterson | G02B 6/1225 |
| 10,122,463 B2 * | 11/2018 | Peterson | G02B 6/1225 |
| 10,374,719 B2 * | 8/2019 | Peterson | H01L 23/49827 |
| 2003/0025562 A1 * | 2/2003 | Andreou | H03F 3/45475 330/308 |
| 2003/0109142 A1 | 6/2003 | Cable et al. | |
| 2004/0114853 A1 | 6/2004 | Bjorkman et al. | |
| 2004/0241892 A1 | 12/2004 | Colgan et al. | |
| 2005/0205930 A1 | 9/2005 | Williams | |
| 2006/0008223 A1 | 1/2006 | Gunn et al. | |
| 2006/0038168 A1 | 2/2006 | Estes et al. | |
| 2006/0210215 A1 | 9/2006 | Aoki et al. | |
| 2007/0080414 A1 | 4/2007 | Bjorkman et al. | |
| 2008/0099928 A1 | 5/2008 | Lee et al. | |
| 2009/0022500 A1 | 1/2009 | Pinguet et al. | |
| 2009/0103855 A1 | 4/2009 | Binkert et al. | |
| 2009/0245795 A1 | 10/2009 | Joyner et al. | |
| 2009/0294814 A1 | 12/2009 | Assefa et al. | |
| 2010/0006784 A1 | 1/2010 | Mack et al. | |
| 2010/0056409 A1 | 3/2010 | Walker et al. | |
| 2010/0060972 A1 | 3/2010 | Kucharski et al. | |
| 2010/0111473 A1 | 5/2010 | Pinguet et al. | |
| 2010/0209114 A1 | 8/2010 | Gloeckner et al. | |
| 2011/0133281 A1 | 6/2011 | Assefa et al. | |
| 2011/0206322 A1 | 8/2011 | Kucharski et al. | |
| 2012/0177381 A1 | 7/2012 | Dobbelaere et al. | |
| 2013/0207127 A1 | 8/2013 | Yu et al. | |
| 2014/0369693 A1 | 12/2014 | Peterson et al. | |

* cited by examiner

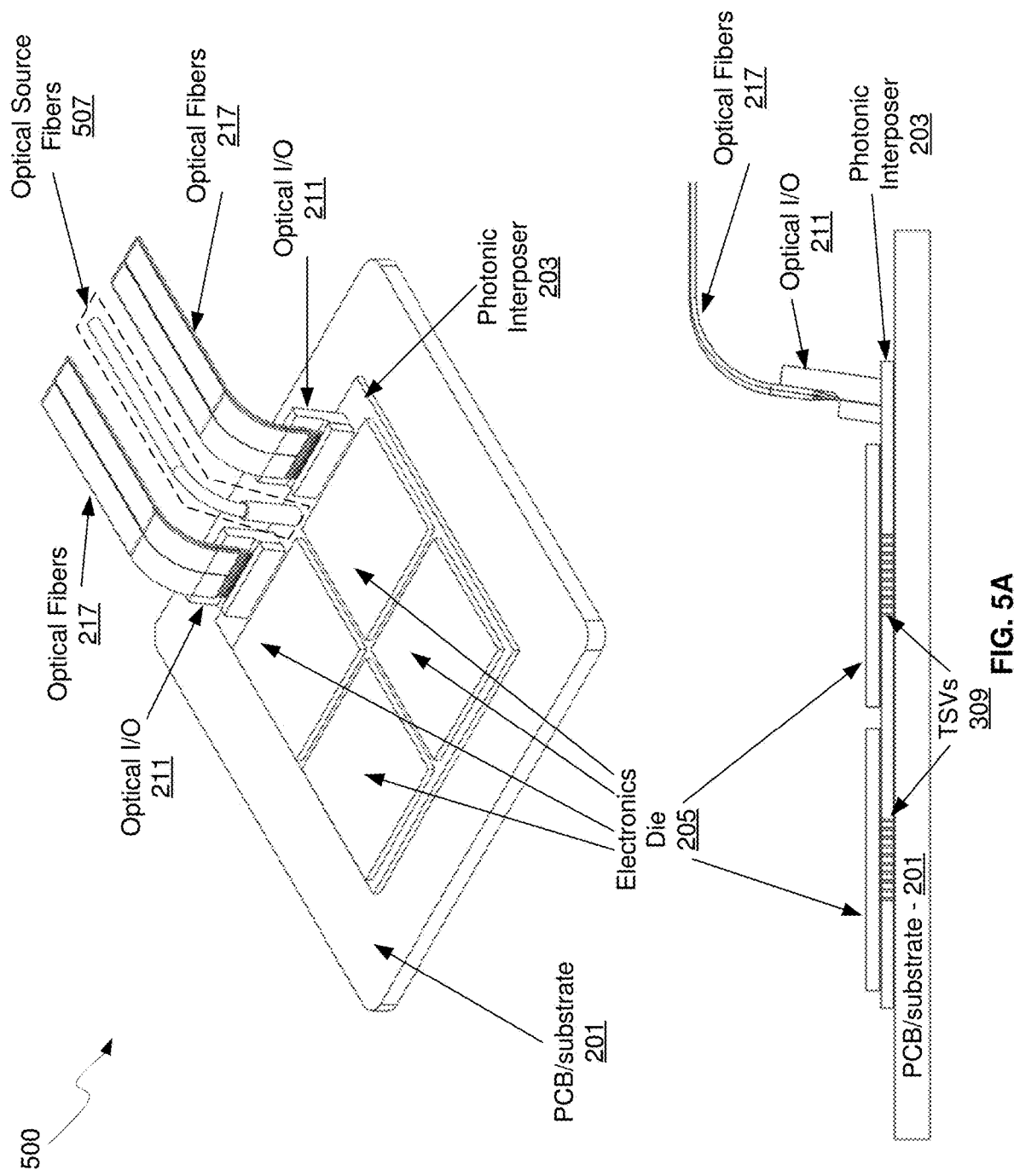

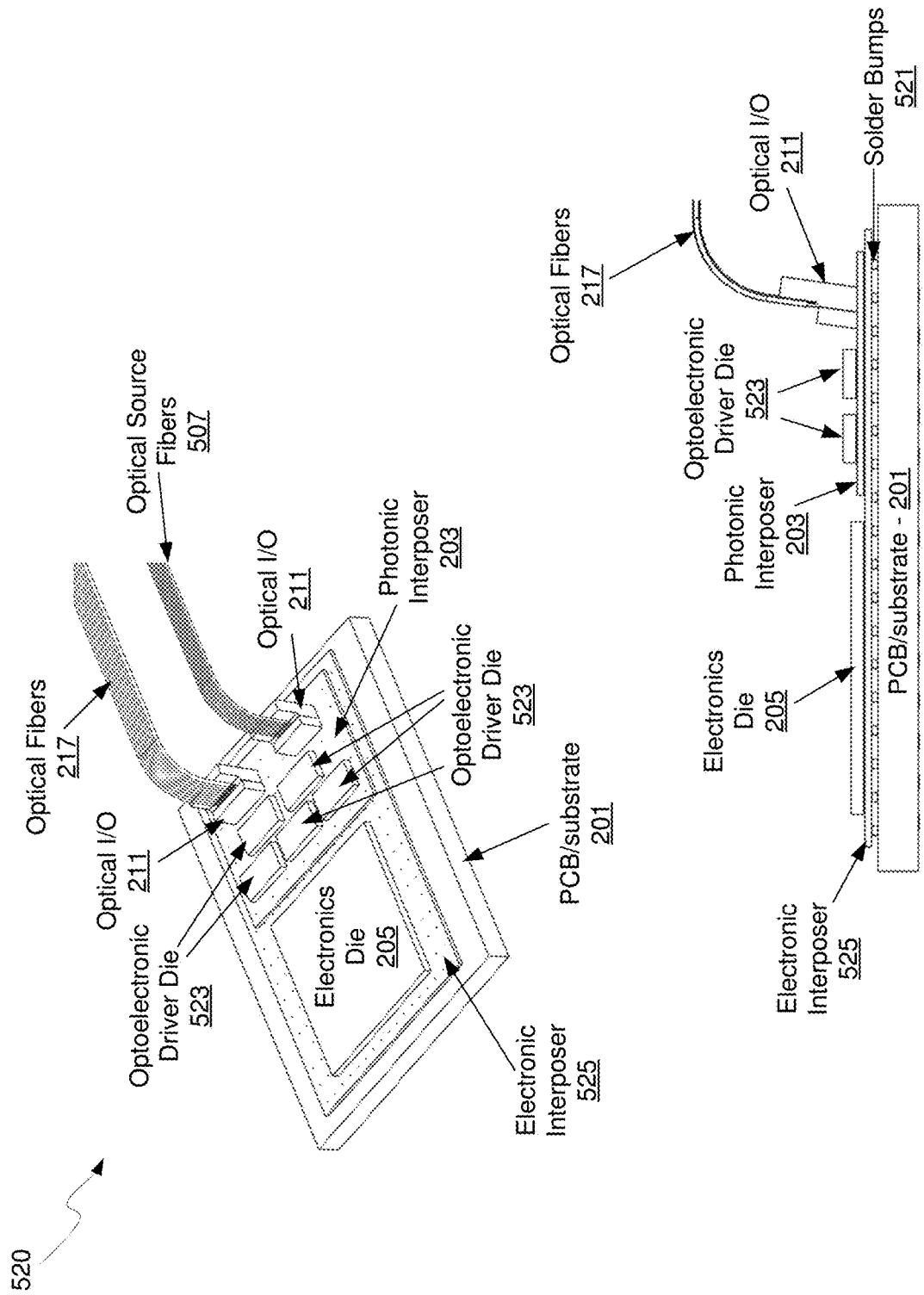

METHOD AND SYSTEM FOR A PHOTONIC INTERPOSER

CROSS-REFERENCE TO RELATED APPLICATIONS/INCORPORATION BY REFERENCE

This application is a continuation of application Ser. No. 16/180,715 filed on Nov. 5, 2018, now U.S. Pat. No. 10,374,719, which is a continuation of application Ser. No. 15/796,063 filed on Oct. 27, 2017, now U.S. Pat. No. 10,122,463, which is a continuation of application Ser. No. 15/165,677 filed on May 26, 2016, now U.S. Pat. No. 9,813,161, which is a continuation of application Ser. No. 14/475,484 filed on Sep. 2, 2014, now U.S. Pat. No. 9,356,701, which is a continuation of application Ser. No. 13/422,776 filed on Mar. 16, 2012, now U.S. Pat. No. 8,831,437, which is a continuation-in-part of U.S. application Ser. No. 12/554,449 filed on Sep. 4, 2009, now U.S. Pat. No. 8,877,616, which makes reference to and claims priority to U.S. Provisional Application Ser. No. 61/191,479 filed on Sep. 8, 2008, and Provisional Application Ser. No. 61/199,353 filed on Nov. 14, 2008. Said application Ser. No. 13/422,776 also claims priority to U.S. Provisional Application 61/516,226, filed on Mar. 30, 2011. Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to semiconductor processing. More specifically, certain embodiments of the invention relate to a method and system for a photonic interposer.

BACKGROUND OF THE INVENTION

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a photonic interposer, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 5A is a diagram illustrating an exemplary photonic interposer with multiple switch cores, in accordance with an embodiment of the invention.

FIG. 5B is a diagram illustrating exemplary photonic and electronic interposers with a switch core and optoelectronic die, in accordance with an embodiment of the invention.

DETAILED DESCRIPTION OF THE INVENTION

Certain aspects of the invention may be found in a method and system for a photonic interposer. Exemplary aspects of the invention may comprise receiving one or more continuous wave (CW) optical signals in a silicon photonic interposer from an optical source external to the silicon photonic interposer. The received CW optical signals may be processed based on electrical signals received from the one or more CMOS electronics die. The modulated optical signals may be received in the silicon photonic interposer from one or more optical fibers coupled to the silicon photonic interposer. Electrical signals may be generated in the silicon photonic interposer based on the received modulated optical signals. The generated electrical signals may be communicated to the one or more CMOS electronics die, via copper pillars for example. The one or more CW optical signals may be received in the silicon photonic interposer from an optical source assembly coupled to the silicon photonic interposer. The one or more CW optical signals may be received from one or more optical fibers coupled to the silicon photonic interposer. The one or more received CW optical signals may be processed utilizing one or more optical modulators in the silicon photonic interposer. The one or more optical modulators may comprise Mach-Zehnder interferometer modulators. The electrical signals may be generated in the silicon photonic interposer utilizing one or more photodetectors integrated in the silicon photonic interposer. Optical signals may be communicated into and/or out of the silicon photonic interposer utilizing grating couplers. The one or more electronics die may comprise one or more of: a processor core, a switch core, or router. The integrated optical communication system comprises a plurality of transceivers.

Figure 1:
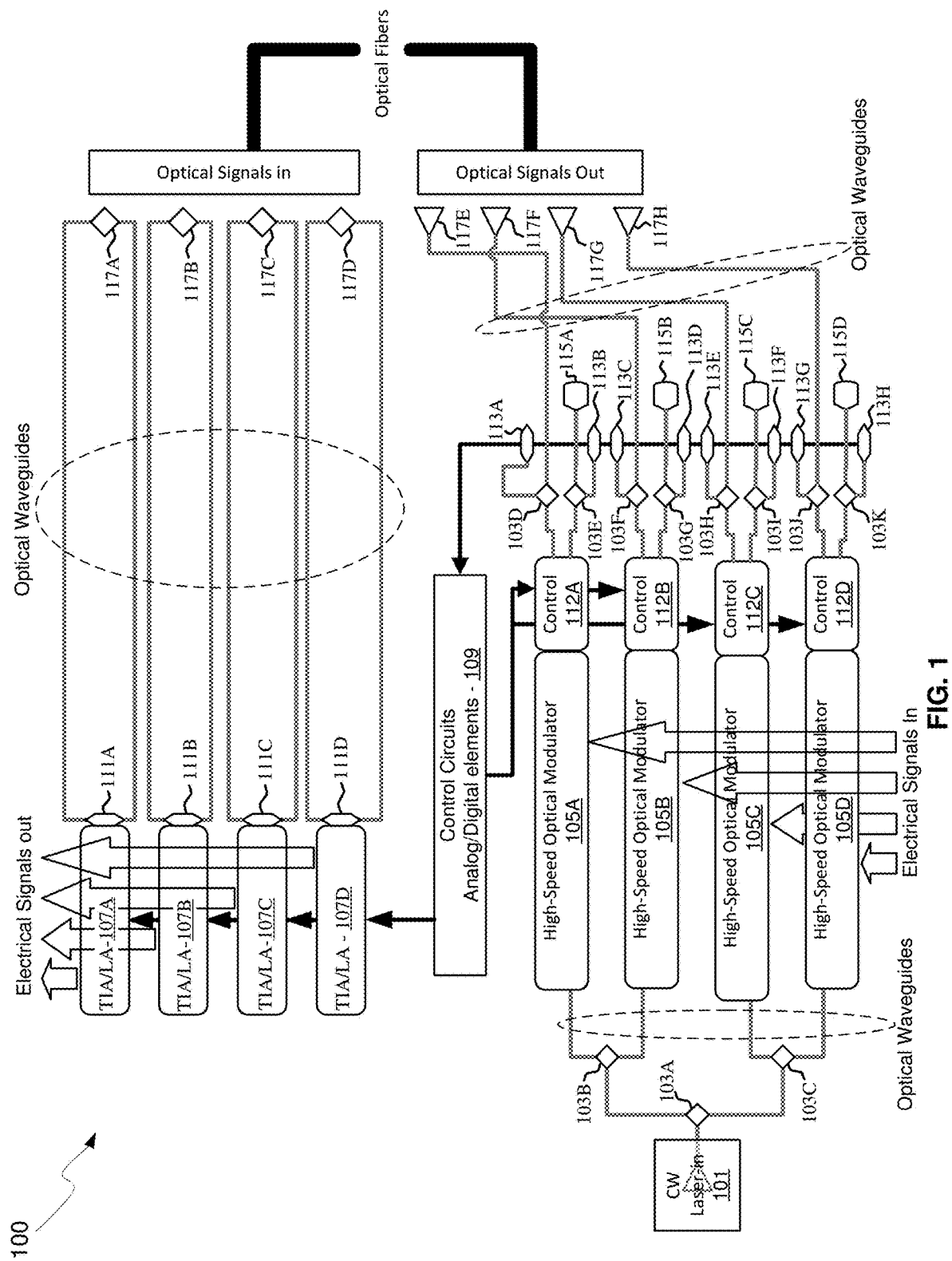
FIG. 1 is a block diagram of a CMOS transceiver utilizing a photonic interposer, in accordance with an embodiment of the invention.

FIG. 1 is a block diagram of a CMOS transceiver utilizing a photonic interposer, in accordance with an embodiment of the invention. Referring to FIG. 1, there is shown optoelectronic devices in a transceiver 100 comprising high speed optical modulators 105A-105D, high-speed photodiodes 111A-111D, monitor photodiodes 113A-113H, and optical devices comprising taps 103A-103K, optical terminations 115A-115D, and grating couplers 117A-117H. There are also shown electrical devices and circuits comprising transimpedance and limiting amplifiers (TIA/LAs) 107A-107D, analog and digital control circuits 109, and control sections 112A-112D. Optical signals are communicated between optical and optoelectronic devices via optical waveguides fabricated in a CMOS interposer chip, with the optical waveguides being indicated in FIG. 1 by the dashed ovals. Optical and optoelectronic devices are integrated in a silicon photonic interposer while electronic devices are integrated into one or more CMOS electronics chips that are coupled to the silicon photonic interposer.

The high speed optical modulators 105A-105D comprise Mach-Zehnder or ring modulators, for example, and enable the modulation of the CW laser input signal. The high speed optical modulators 105A-105D are controlled by the control sections 112A-112D, and the outputs of the modulators are optically coupled via waveguides to the grating couplers 117E-117H. The taps 103D-103K comprise four-port optical couplers, for example, and are utilized to sample the optical signals generated by the high speed optical modulators 105A-105D, with the sampled signals being measured by the monitor photodiodes 113A-113H. The unused branches of the taps 103D-103K are terminated by optical terminations 115A-115D to avoid back reflections of unwanted signals.

The grating couplers 117A-117H comprise optical gratings that enable coupling of light into and out of the silicon photonic interposer. The grating couplers 117A-117D may be utilized to couple light received from optical fibers into the silicon photonic interposer, and may comprise polarization independent grating couplers. The grating couplers 117E-117H may be utilized to couple light from the silicon photonic interposer into optical fibers. The optical fibers may be epoxied, for example, to the CMOS chip, and may be aligned at an angle from normal to the surface of the silicon photonic interposer to optimize coupling efficiency.

The high-speed photodiodes 111A-111D convert optical signals received from the grating couplers 117A-117D into electrical signals that are communicated to the TIA/LAs 107A-107D for processing. The analog and digital control circuits 109 may control gain levels or other parameters in the operation of the TIA/LAs 107A-107D. The TIA/LAs 107A-107D, the analog and digital control circuits 109, and the control sections 112A-112D may be integrated on one or more electronics CMOS chips that may be bonded to the silicon photonic interposer via copper pillars. In this manner, electronic and photonic performance may be optimized independently on different CMOS nodes. The TIA/LAs 107A-107D may then communicate electrical signals to other circuitry on the electronics chip.

The TIA/LAs 107A-107D may comprise narrowband, non-linear optoelectronic receiver circuitry. Accordingly, the narrowband receiver front-end may be followed by a restorer circuit, such as, for example, a non-return to zero (NRZ) level restorer circuit. A restorer circuit limits the bandwidth of the optical receiver in order to decrease the integrated noise, thereby increasing the signal to noise ratio. An NRZ level restorer may be used to convert the resulting data pulses back into NRZ data.

The control sections 112A-112D comprise electronic circuitry that enable modulation of the CW laser signal received from the taps 103A-103C. The high speed optical modulators 105A-105D require high-speed electrical signals to modulate the refractive index in respective branches of a Mach-Zehnder interferometer (MZI), for example.

In an embodiment of the invention, the integration of all optical and optoelectronic devices required for a transceiver into a single silicon photonic interposer, and of all required electronic devices on one or more CMOS electronics chips, enables optimized performance of the resulting single hybrid package. In this manner, electronic device performance may be optimized independently of the optimization of photonic devices in the silicon photonic interposer. For example, the electronic CMOS chip may be optimized on a 32 nm CMOS process, while the silicon photonic interposer may be optimized on a 130 nm CMOS node. The electronics devices may be placed on the electronics chip such that they are located directly above their associated photonics devices when bonded to the silicon photonic interposer. For example, the control sections 112A-112D may be located on an electronics CMOS chip such that they lie directly above the high-speed optical modulators 105A-105B and can be coupled by low parasitic copper pillars.

In an exemplary embodiment, the hybrid transceiver 100 comprises four optoelectronic transceivers with one optical source, and enables communication of optical signals vertically to and from the surface of the silicon photonic interposer, thereby enabling the use of CMOS processes and structures, including a CMOS guard ring. The silicon photonic interposer may comprise both active devices, such as photodetectors and modulators, and passive devices, such as waveguides, splitters, combiners, and grating couplers, thereby enabling photonic circuits to be integrated on CMOS chips.

Figure 2A:
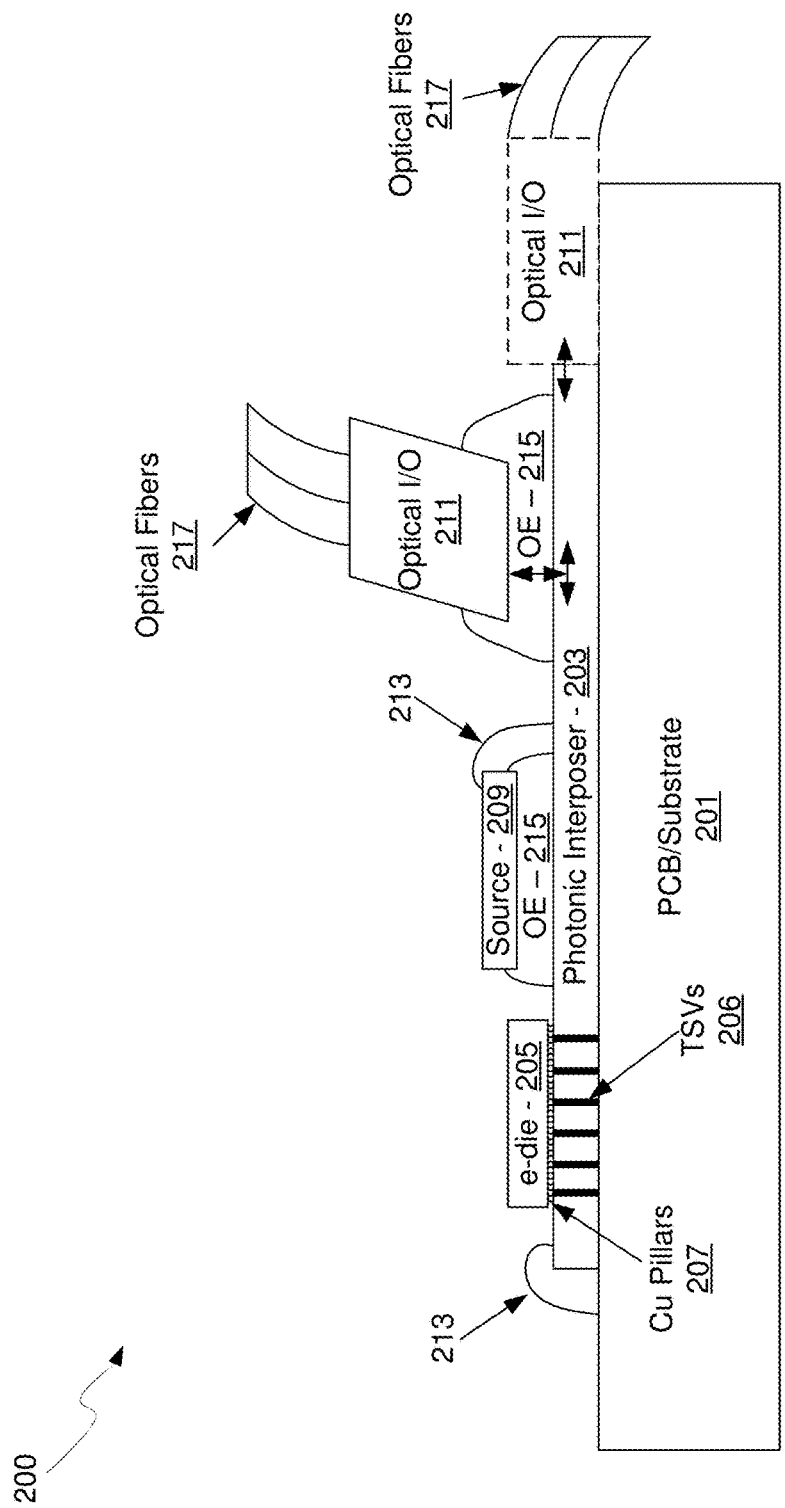
FIG. 2A is a schematic illustrating an exemplary optical transceiver including a photonic interposer, in accordance with an embodiment of the invention.

FIG. 2A is a schematic illustrating an exemplary optical transceiver including a photonic interposer, in accordance with an embodiment of the invention. Referring to FIG. 2A, there is shown a photonic transceiver 200 comprising a printed circuit board (PCB)/substrate 201, a silicon photonic interposer 203, an electronic CMOS die 205, through silicon vias (TSVs) 206, copper pillars 207, an optical source module 209, an optical input/output (I/O) 211, wire bonds 213, optical epoxy 215, and optical fibers 217.

The PCB/substrate 201 may comprise a support structure for the photonic transceiver 200, and may comprise both insulating and conductive material for isolating devices as well as providing electrical contact for active devices on the silicon photonic interposer 203 as well as to devices on the electronics die 205 via the silicon photonic interposer 203. In addition, the PCB/substrate may provide a thermally conductive path to carry away heat generated by devices and circuits in the electronics die 205 and the optical source module 209.

The silicon photonic interposer 203 may comprise a CMOS chip with active and passive optical devices such as waveguides, modulators, photodetectors, grating couplers, taps, and combiners, for example. The functionalities supported by the silicon photonic interposer 203 may comprise photo-detection, optical modulation, optical routing, and optical interfaces for high-speed I/O and optical power delivery.

The silicon photonic interposer 203 may also comprise copper pillars 207 for coupling the electronics die 205 to the silicon photonic interposer 203, as well as grating couplers for coupling light into the die from the optical source module 209 and into/out of the die via the optical I/O 211. In addition, the silicon photonic interposer 203 may comprise TSVs 206 for electrical interconnection through the die, such as between the PCB/substrate 201 and the electronics die 205. Optical interfaces may also be facilitated by the optical epoxy 215, providing both optical transparency and mechanical fixation.

The electronics die 205 may comprise one or more electronic CMOS chips that provide the required electronic functions of the photonic transceiver 200. The electronics die 205 may comprise a single chip or a plurality of die coupled to the silicon photonic interposer 203 via the copper pillars 207. The electronics die 205 may comprise TIA's, LNAs, and control circuits for processing optical signals in the photonics chip 203. For example, the electronics die 205 may comprise driver circuitry for controlling optical modulators in the silicon photonic interposer 203 and variable gain amplifiers for amplifying electrical signals received from photodetectors in the silicon photonic interposer 203. By incorporating photonics devices in the silicon photonic interposer 203 and electronic devices in the electronics die 205, the CMOS processes for each chip may be optimized for the type of devices incorporated.

The TSVs 206 may comprise electrically conductive paths that extend vertically through the silicon photonic interposer 203 and provide electrical connectivity between the electronics die 205 and the PCB/substrate 201. This may be utilized in place of wire bonds, such as the wire bonds 213, or in conjunction with wire bonds.

The copper pillars 207 may comprise linear or 2D arrays of metal pillars to provide electrical contact between the silicon photonic interposer 203 and the electronics die 205. For example, the copper pillars 207 may provide electrical contact between photodetectors in the silicon photonic interposer 203 and associated receiver circuitry in the electronics die 205. In addition, the copper pillars 207 may provide mechanical coupling of the electronics and photonics die, and may be encapsulated with underfill to protect the metal and other surfaces.

The optical source module 209 may comprise an assembly with an optical source, such as a semiconductor laser, and associated optical and electrical elements to direct one or more optical signals into the silicon photonic interposer 203. An example of the optical source module is described in U.S. patent application Ser. No. 12/500,465 filed on Jul. 9, 2009, which is hereby incorporated herein by reference in its entirety. In another exemplary scenario, the optical signal or signals from the optical source assembly 209 may be coupled into the silicon photonic interposer 203 via optical fibers affixed above grating couplers in the silicon photonic interposer 203.

The optical I/O 211 may comprise an assembly for coupling the optical fibers 217 to the silicon photonic interposer 203. Accordingly, the optical I/O 211 may comprise mechanical support for one or more optical fibers and an optical surface to be coupled to the silicon photonic interposer 203, such as by the optical epoxy 215. In another exemplary scenario, the optical I/O 211 may also be affixed along an edge of the silicon photonic interposer 203, as shown by the dashed line optical I/O 211, enabling the coupling of optical signals directly into optical waveguides as opposed to grating couplers on the surface of the silicon photonic interposer 203.

In operation, continuous-wave (CW) optical signals may be communicated into the silicon photonic interposer 203 from the optical source module 209 via one or more grating couplers in the silicon photonic interposer 203. Photonic devices in the silicon photonic interposer 203 may then process the received optical signal. For example, one or more optical modulators may modulate the CW signal based on electrical signals received from the electronics die 205. Electrical signals may be received from the electronics die 205 via the Cu pillars 207. By integrating modulators in the silicon photonic interposer 203 directly beneath the source of the electrical signals in the electronics die 205, signal path lengths may be minimized, resulting in very high speed performance. For example, utilizing ~20 micron Cu pillars with <20 fF capacitance, speeds of 50 GHz and higher can be achieved.

The modulated optical signals may then be communicated out of the silicon photonic interposer 203 via grating couplers situated beneath the optical I/O 211. In this manner, high-speed electrical signals generated in the electronics die 205 may be utilized to modulate a CW optical signal and subsequently communicated out of the silicon photonic interposer 203 via the optical fibers 217.

Similarly, modulated optical signals may be received in the silicon photonic interposer 203 via the optical fibers 217 and the optical I/O 211. The received optical signals may be communicated within the silicon photonic interposer 203 via optical waveguides to one or more photodetectors integrated in the silicon photonic interposer 203. The photodetectors may be integrated in the silicon photonic interposer 203 such that they lie directly beneath the associated receiver electronics circuitry in the electronics die 205 when bonded and electrically coupled by the low parasitic capacitance Cu pillars 207.

The hybrid integration of CMOS electronics die on silicon photonic interposer via Cu pillars enables very high speed optical transceivers utilizing CMOS processes. In addition, integrating separate photonic and electronic die enables the independent optimization of the performance of electronic and photonic functions within the respective CMOS processes. The electronic die, which is mounted by face-to-face bonding to the silicon photonic interposer, may contain electrical circuits that "drive" the photonic circuits on the interposer. Those circuits replace the electronic signaling drive circuits from conventional electrical interconnect solutions.

In addition, optical interconnect between multiple electronic die, i.e. chip-to-chip interconnect, is enabled by the silicon photonic interposer 203, where transceiver functions are supported by the combined electronic die and interposer and the associated optical routing on the silicon photonic interposer die 203. The invention is not limited to the arrangement shown in FIG. 2A. Accordingly, various stacking arrangements are possible. For example, photonic interposers may be sandwiched between electronic chips and stacks of interposers/electronic chips may be configured resulting in a 3-dimensional structure.

Figure 2B:
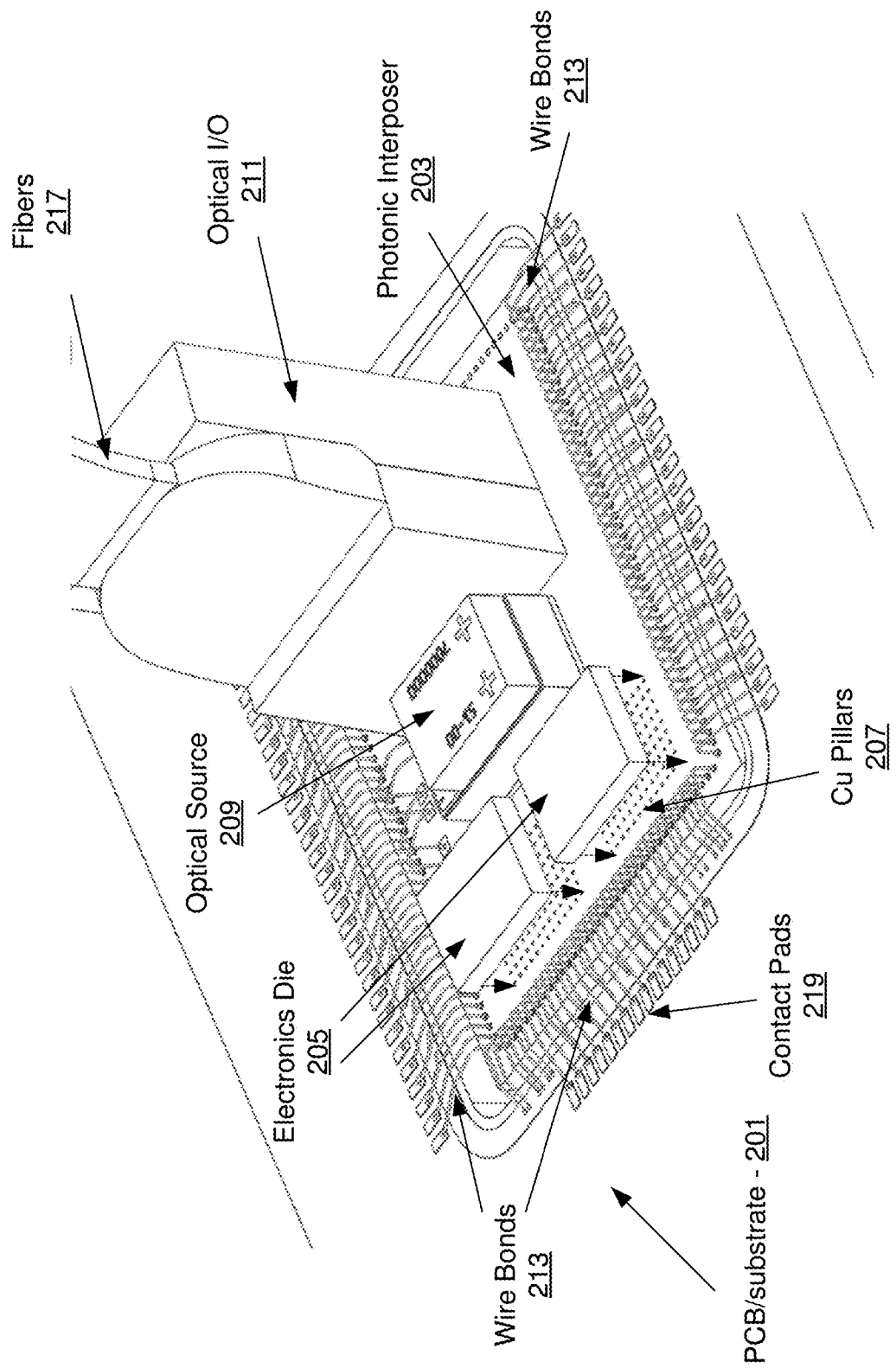
FIG. 2B is a perspective view of a hybrid integration photonic transceiver, in accordance with an embodiment of the invention.

FIG. 2B is a perspective view of a hybrid integration photonic transceiver, in accordance with an embodiment of the invention. Referring to FIG. 2B, there is shown the PCB/substrate 201, the silicon photonic interposer 203, electronics die 205, the Cu pillars 207, the optical source assembly 209, the optical I/O 211, wire bonds 213, optical fibers 217, and contact pads 219.

The electronics die 205 are shown prior to bonding to the surface of the silicon photonic interposer 203 via the Cu pillars 207, as illustrated by the dashed arrows below each die. While two electronics die 205 are shown in FIG. 2B, it should be noted that the invention is not so limited. Accordingly, any number of electronics die may be coupled to the silicon photonic interposer 203 depending on the number of transceivers, the particular CMOS node utilized, thermal conductance, and space limitations, for example.

In another exemplary embodiment, the optical source assembly 209 may be located remotely and one or more optical fibers may be utilized to couple the optical source signal into the silicon photonic interposer 203 via grating couplers, for example.

In an exemplary embodiment, electronic functions may be integrated into the electronics die 205 and photonics circuitry may be integrated into the silicon photonic interposer 203 utilizing independent CMOS processes. The electronics die 205 may comprise electronic devices associated with photonic devices in the silicon photonic interposer 203, thereby minimizing electrical path lengths while still allowing independent performance optimization of electronic and photonic devices. For example, the CMOS processes that result in the highest electronics performance, such as the fastest switching speed, may not be optimum for CMOS photonics performance. Similarly, different technologies may be incorporated in the different die. For example, SiGe CMOS processes may be used for photonic devices such as photodetectors, and 32 nm CMOS processes may be used for electronic devices on the electronics die 205.

The silicon photonic interposer 203 may comprise photonic circuits, whereby optical signals may be received, processed, and transmitted out of the silicon photonic interposer 203. The optical source assembly 209 may provide a CW optical signal to the silicon photonic interposer 203, with the photonics circuitry in the silicon photonic interposer 203 processing the CW signal. For example, the CW signal may be coupled into the silicon photonic interposer 203 via grating couplers, communicated to various locations on the die via optical waveguides, modulated by Mach-Zehnder interferometer (MZI) modulators, and communicated out of the silicon photonic interposer 203 into optical fibers. In this manner, the hybrid integration of a plurality of high performance optical transceivers is enabled in CMOS processes.

In another exemplary scenario, the silicon photonic interposer 203 may provide optical routing between electronics die. For example, the electronics die 205 may comprise a plurality of processors and memory die. Electrical signals from the electronics die 205 may be communicated to modulators on the silicon photonic interposer 203 via copper pillars, for example, and converted to optical signals for routing to another electronics die via optical waveguides before being converted back to electronic signals utilizing photodetectors. In this manner, very high-speed coupling is enabled for a plurality of electronics die, reducing the memory requirements on processor chips, for example.

The utilization of optical signals for interconnecting electronics die enables very dense and low power interconnects, since no controlled impedance lines are necessary. Furthermore, costs may be reduced with integration on a photonics-only die since there is thus no power dissipation die in the interposer, and the electronics die may be heat sinked with conventional methods.

Figure 2C:
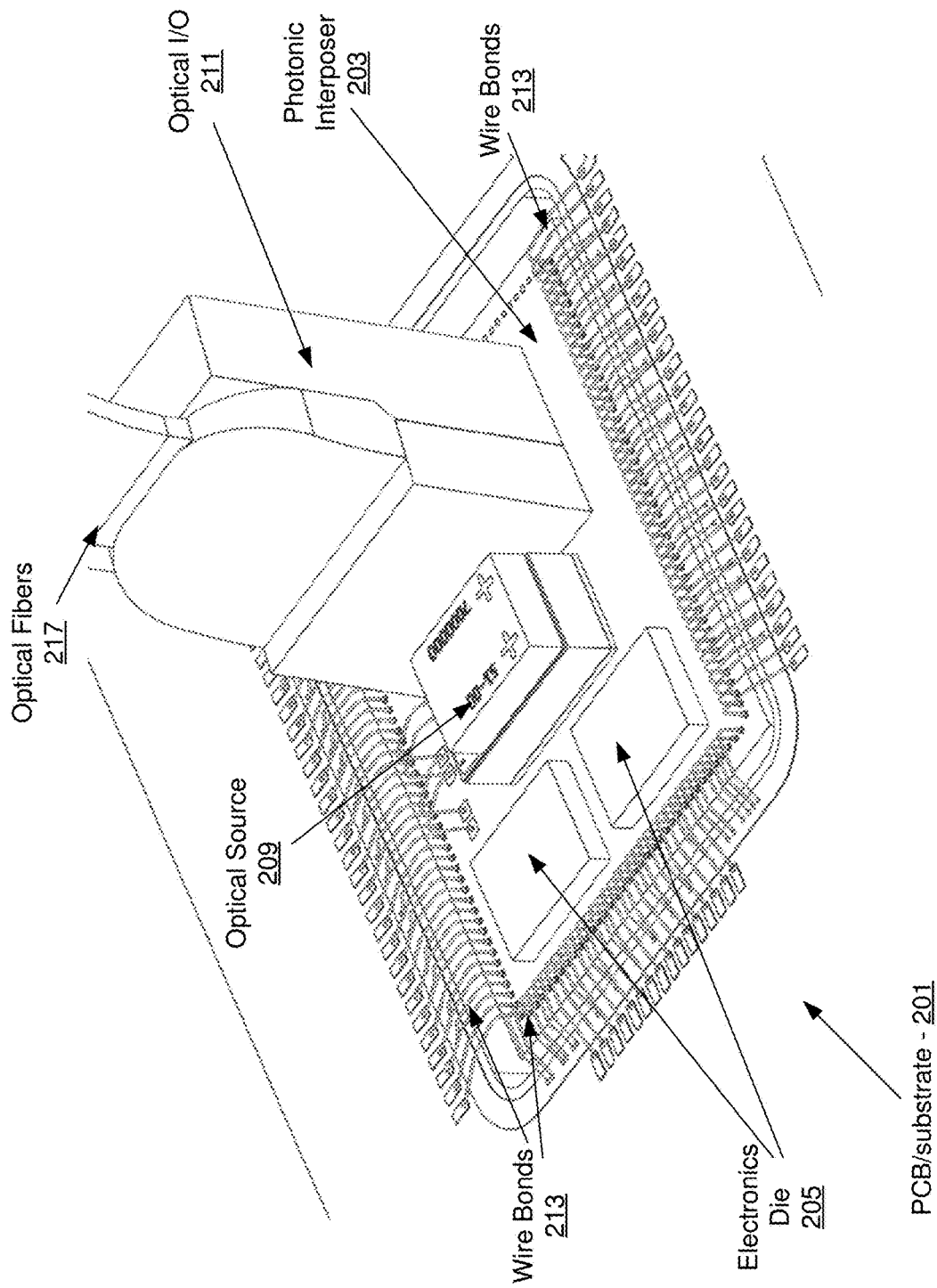
FIG. 2C is a perspective view of a photonic interposer with two coupled electronics die, in accordance with an embodiment of the invention

FIG. 2C is a perspective view of a photonic interposer with two coupled electronics die, in accordance with an embodiment of the invention. Referring to FIG. 2C, there is shown the PCB/substrate 201, the silicon photonic interposer 203, electronics die 205, the optical source assembly 209, the optical I/O 211, wire bonds 213, and optical fibers 217.

The electronics die 205 are shown bonded to the surface of the silicon photonic interposer 203 via Cu pillars. While two electronics die 205 are shown in FIG. 2C, it should again be noted that the invention is not necessarily so limited. Accordingly, any number of electronics die may be coupled to the silicon photonic interposer 203 depending on number of transceivers, the particular CMOS node utilized, thermal conductance, and space limitations, for example.

In an exemplary embodiment, electronic functions may be integrated into the electronics die 205 and photonics circuitry may be integrated into the silicon photonic interposer 203 utilizing independent CMOS processes. The electronics die 205 may comprise electronic devices associated with photonic devices in the silicon photonic interposer 203, thereby minimizing electrical path lengths while still allowing independent performance optimization of electronic and photonic devices. Different technologies may be incorporated in the different die. For example, SiGe CMOS processes may be used for photonic devices in the silicon photonic interposer 203, such as photodetectors and modulators, and 32 nm CMOS processes may be used for electronic devices on the electronics die 205.

In another exemplary scenario, one of the electronics die 205 may comprise a conventional application specific integrated circuit (ASIC) and a second electronics die 205 may comprise a driver die with circuitry for driving the photonics devices in the silicon photonic interposer 203. Accordingly, the driver die may receive electronic signals from the ASIC via the silicon photonic interposer 203 and use the received signals to subsequently drive photonic devices in the silicon photonic interposer 203. In this manner, the second die provides the driver circuitry as opposed to integrating driver circuitry in the ASIC. This may allow existing ASIC designs to be integrated with the silicon photonic interposer 203 without any modification to the ASIC I/O circuitry. These exemplary embodiments are illustrated further with respect to FIGS. 5B and 5C.

The silicon photonic interposer 203 may comprise photonic circuits, whereby optical signals may be received, processed, and transmitted out of the silicon photonic interposer 203. The optical source assembly 209 may provide a CW optical signal to the silicon photonic interposer 203 and biased by voltages coupled to the optical source assembly 209 via wire bonds 213. Photonics circuitry in the silicon photonic interposer 203 may then process the CW signal. For example, the CW signal may be coupled into the silicon photonic interposer 203 via grating couplers, communicated to various locations on the die via optical waveguides, modulated by MZI modulators, and communicated out of the silicon photonic interposer 203 into the optical fibers 217 via the optical I/O 211.

Heat may be conducted away from the die via the PCB/substrate 201. In this manner, the silicon photonic interposer and electronics die 205 may enable a plurality of high performance optical transceivers using separately optimized CMOS processes. Similarly, the silicon photonic interposer 203 may enable high-speed interconnects between electronic circuits in the electronics die 205, such as between processor cores and memory, for example.

Figure 3:
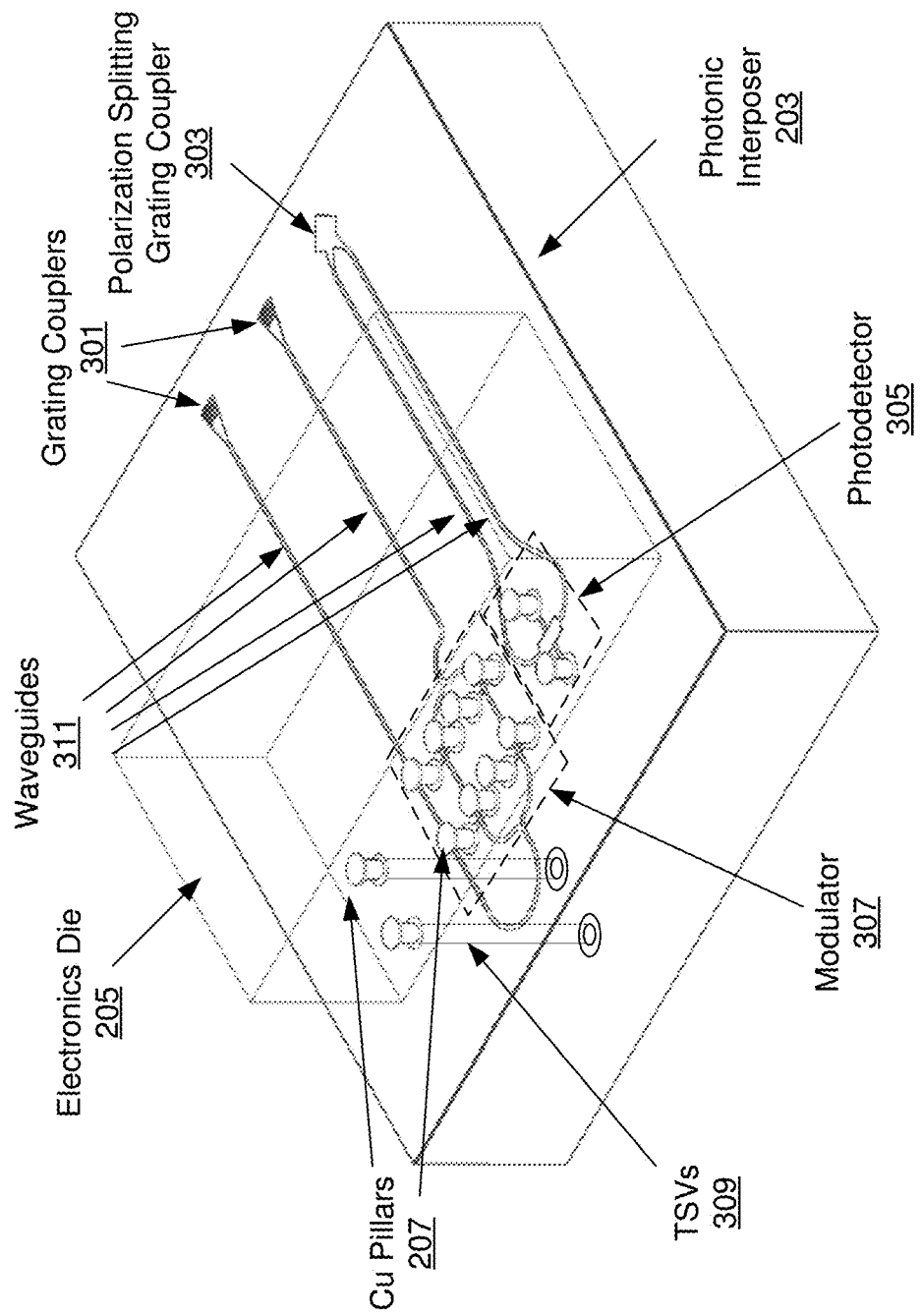
FIG. 3 is a schematic illustrating the hybrid integration of an electronics die to a photonics interposer, in accordance with an embodiment of the invention.

FIG. 3 is a schematic illustrating the hybrid integration of an electronics die to a photonics interposer, in accordance with an embodiment of the invention. Referring to FIG. 3, there is shown the electronics die 205, copper pillars 207, and the silicon photonic interposer 203. The silicon photonic interposer 203 may comprise grating couplers 301, a polarization splitting grating coupler 303, a photodetector 305, an optical modulator 307, TSVs 309, and optical waveguides 311.

The Cu pillars 207 provide both electrical and mechanical coupling between the electronics die 205 and the silicon photonic interposer 203. The grating couplers 301 provide for the coupling of light into and/or out of the photonics die/interposer 300. Similarly, the polarization-splitting grating coupler 303 may enable the coupling of two polarizations of light into and/or out of the photonics die/interposer 203.

The modulator 307 may comprise a MZI modulator, for example, and may be operable to modulate an optical signal based on electrical signals received from the electronics die 205 via the Cu pillars 207. In an exemplary scenario, a CW optical signal may be received from an optical source via one of the grating couplers 301, communicated via the optical waveguides 311, modulated by the optical modulator 307, communicated back by the optical waveguides 311, and out of the silicon photonic interposer 203 via the other grating coupler 301.

The photodetector 305 may comprise a semiconductor photodiode, for example, and may be operable to convert a received optical signal to an electrical signal. In an exemplary scenario, optical signals with perpendicular polarizations may be received by the polarization-splitting grating coupler 303, communicated via the waveguides 311, converted to an electrical signal by the photodetector 305, with the resulting electrical signals communicated to the electronics die 205 via the Cu pillars 207. The electrical signals may be further processed by electronics in the electronics die 205 and/or communicated to other circuitry via wire bonds or the Cu pillars 207 and the TSVs 309.

The silicon photonic interposer 203 comprises a CMOS photonics die that may provide photonic circuits for a plurality of electronics die, thereby reducing or eliminating electrical interconnects between high-speed electronics. This may be utilized for high-speed memory access, high-speed processor interconnects, and coupling a plurality of high-speed electronics chips, for example.

Figure 4:
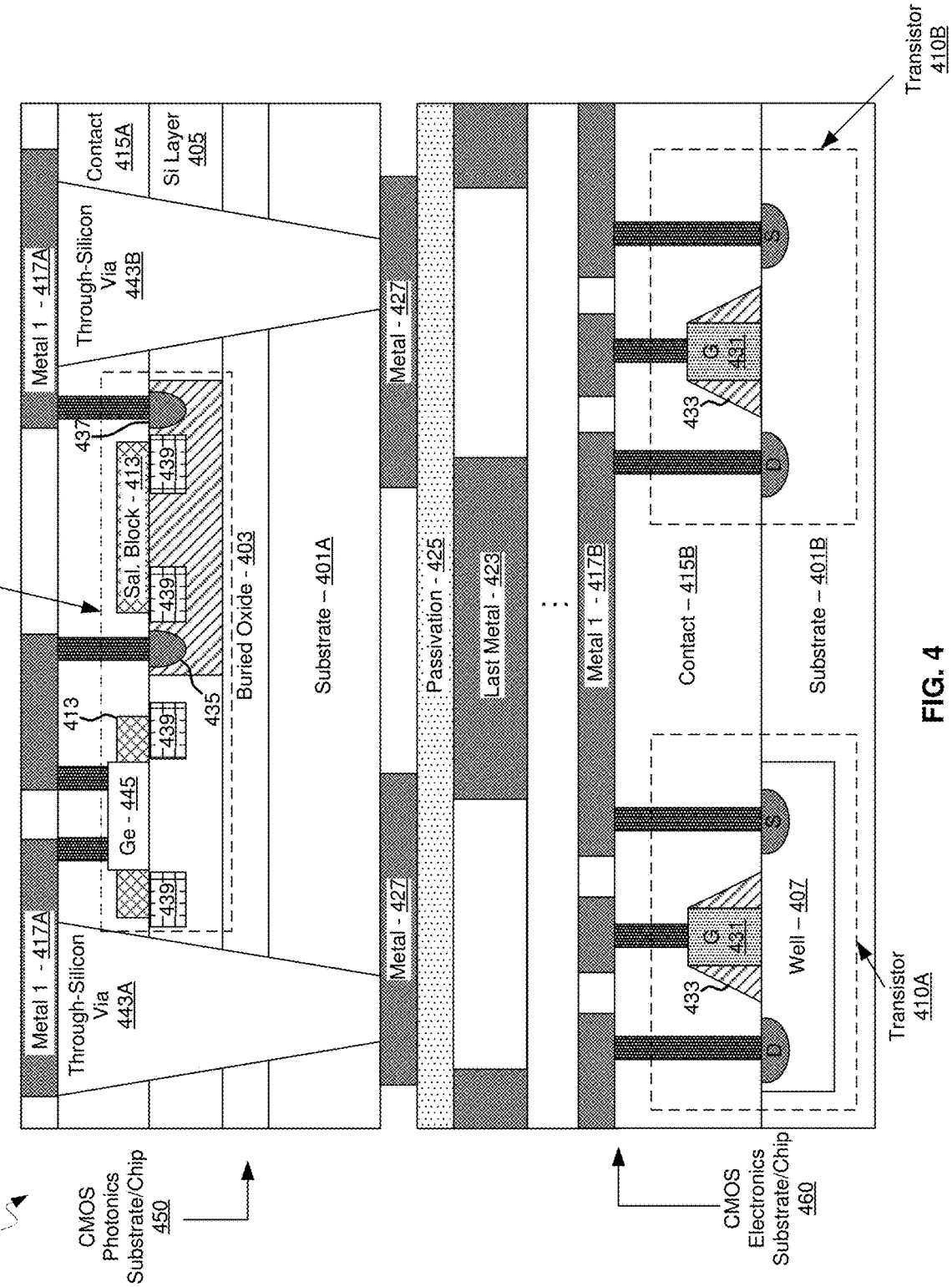
FIG. 4 is a schematic illustrating a cross-section of exemplary metal pillar-coupled electrical and optoelectronic devices, in accordance with an embodiment of the invention.

FIG. 4 is a schematic illustrating a cross-section of exemplary metal pillar-coupled electrical and optoelectronic devices, in accordance with an embodiment of the invention. Referring to FIG. 4, there is shown a hybrid integrated semiconductor structure 400 comprising a CMOS photonics substrate/chip/die 450, a CMOS electronics substrate/chip/die 460, and a metal layer 427 for substrate/chip physical and electrical coupling. The CMOS photonics substrate/chip/die 450 comprises optical devices 420 and associated layers, and the CMOS electronics substrate/chip/die 460 comprises transistors 410A and 410B and associated layers. The layers of the die are utilized to fabricate the transistors 410A and 410B and the optical devices 420, to isolate, and to provide electrical connection to the devices, for example.

The CMOS photonics substrate/chip/die 450 comprises a substrate 401A, a buried oxide 403, a Si-layer 405, a contact layer 415A, a metal 1 layer 417A, and through-silicon vias (TSVs) 443A and 443B. The optical devices 420 comprise doped and/or undoped regions of the Si-layer 405, a salicide block 413, doped contact regions 435 and 437, etched region 439, and the Ge-layer 445. The salicide block 413 comprises a layer of material to prevent the silicon of the optical devices 420 and other optical devices from being salicided during the standard CMOS process. If silicon in the optical devices was salicided, large optical losses would result. Additionally, the salicide block 413 blocks unwanted implants into the waveguides and other optical devices, which would also cause unwanted loss. The salicide block 413 may be etched to the Si-layer 405 so that the Ge-layer 445 may be deposited. The Ge-layer 445 may be utilized in a photodetector device, for example. In addition, etched regions 439 in the Si-layer 405 may be utilized for optical confinement. The etch regions 439 may be refilled with a low-k dielectric, for example, or may comprise an air gap with no refill material. Fill material may comprise silicon oxide or oxynitride materials, for example.

The CMOS electronics substrate/chip/die 460 comprises a silicon substrate 401B, a well 407, a contact layer 415B, a metal 1 layer 417B, a last metal layer 423, a passivation layer 425, and the metal layer 427. The metal 1 layer 417B, the last metal layer 423, and the metal layer 427 provide electrical contact between layers and to electrical and optoelectronics devices, such as the transistors 410A and 410B and the optical devices 420. The contact layer 415 also enables electrical contact to the devices while providing electrical isolation between devices by incorporating insulating materials between conductive vias.

The transistors 410A and 410B comprise a bulk transistor with source and drain regions formed in the well 407 or the substrate 401B, respectively, from dopant implant processes, for example, as well as a gate 431, and a passivation layer 433. The gate 431 may comprise metal or polysilicon, for example, and may be isolated from the well 407 by a thin oxide layer (not shown).

In an embodiment of the invention, separate CMOS processes may be utilized to fabricate the CMOS photonics substrate/chip/die 450 and the CMOS electronics substrate/chip/die 460 so that the processes may be optimized for each type of device. The CMOS photonics substrate/chip/die 450 may comprise a photonic interposer, such as the silicon photonic interposer 203, that is operable to couple to one or more electronics die for communicating high-speed signals between the electronics die without the need for impedance-controlled electrical paths. The interposer and the electronics die may be fabricated in different CMOS processes. In this manner, layer thicknesses and doping levels may be configured for the best electronic and photonic performance in the respective structure without the tradeoffs in performance associated with fabricating electronic and photonic structures concurrently.

FIG. 5A is a diagram illustrating an exemplary photonic interposer with multiple switch cores, in accordance with an embodiment of the invention. Referring to FIG. 5A, there is shown a multi-core photonic interposer switch 500 comprising the PCB/substrate 201, the silicon photonic interposer 203, electronics die 205, the optical I/O 211, the optical fibers 217, TSVs 309, and the optical source 507.

The optical source 507 comprises a fiber and optical I/O that receive an optical signal from a source, such as a laser, thereby eliminating the need for an optical source assembly to be coupled directly to the silicon photonic interposer 203 as shown in FIGS. 2A-2C. The fiber in the optical source 507 may comprise a single-mode fiber for coupling a single mode into the silicon photonic interposer 203. In an exemplary embodiment, the optical source 507 provides a CW optical signal to the silicon photonic interposer 203.

In another exemplary scenario, the four electronics die 205 may comprise routers, switches, and/or processor cores for processing electrical signals. The electronics die 205 may be heatsinked through the backside of the chips, where the backside is the upward facing side of the electronics die 205 in FIG. 5A, opposite to the side coupled to the silicon photonic interposer 203. The multi-core photonic interposer switch 500 may comprise a 1.2 Terabit switch, with 300 Gb/s interconnect speed between each core via the silicon photonic interposer 203, and 1.2 Tb/s communication into and out of the multi-core photonic interposer switch 500 via the optical fibers 217.

FIG. 5B is a diagram illustrating exemplary photonic and electronic interposers with a switch core and optoelectronic die, in accordance with an embodiment of the invention. Referring to FIG. 5A, there is shown a switch core assembly 520 comprising the PCB/substrate 201, the silicon photonic interposer 203, electronics die 205, the optical I/O 211, the optical fibers 217, and the optical source fibers 507. There are also shown solder bumps 521, optoelectronic driver die 523, and an electronic interposer 525.

The electronic interposer 523 may comprise an interposer for electrically coupling a standard ASIC chip to photonic circuitry in the photonic interposer 203 and the optoelectronic driver die 523. This may allow a standard chip to be integrated with a photonic assembly without requiring any I/O modifications in the electronics die 205. Accordingly, it is not necessary that the electronics die 205 drive or receive signals from optoelectronic devices such as modulators or photodiodes in the photonic interposer 203. These functions may be integrated in the optoelectronic driver die 523, allowing for complete flexibility in utilizing a standard electrical interface in the electronics die 205.

The solder bumps 521 may comprise spherical metal contacts for electrically and physically coupling the electronic interposer 525 to the PCB/substrate 201.

Figure 5C:
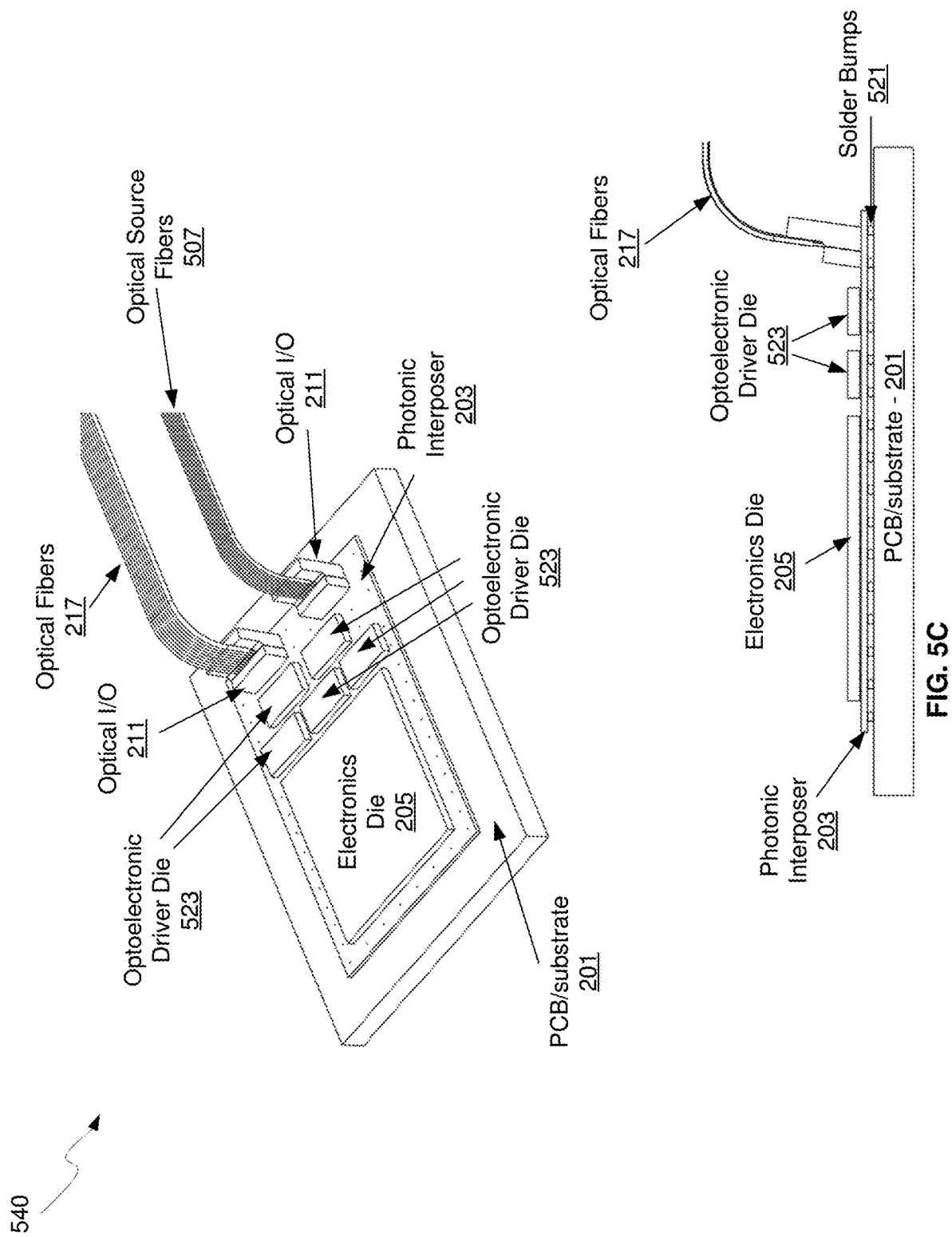
FIG. 5C is a diagram illustrating an exemplary photonic interposer with a switch core and optoelectronic die, in accordance with an embodiment of the invention.

FIG. 5C is a diagram illustrating an exemplary photonic interposer with a switch core and optoelectronic die, in accordance with an embodiment of the invention. Referring to FIG. 5C, there is shown a switch core assembly 540 comprising the PCB/substrate 201, the silicon photonic interposer 203, electronics die 205, the optical I/O 211, the optical fibers 217, the optical source fibers 507, the solder bumps 521, and the optoelectronic driver die 523.

In an exemplary scenario, the silicon photonic interposer 203 may electrically couple a standard ASIC chip to photonic circuitry in the photonic optoelectronic driver die 523, essentially combining the functions of the electronics interposer 525 of FIG. 5B into the silicon photonic interposer 203 of FIG. 5C. This may allow a standard chip to be integrated with a photonic assembly without requiring any I/O modifications in the electronics die 205. Accordingly, it is not necessary that the electronics die 205 directly drive or receive signals from optoelectronic devices such as modulators or photodiodes in the photonic interposer 203. These functions may be integrated in the optoelectronic driver die 523, allowing for complete flexibility in utilizing a standard electrical interface in the electronics die 205.

Figure 6:
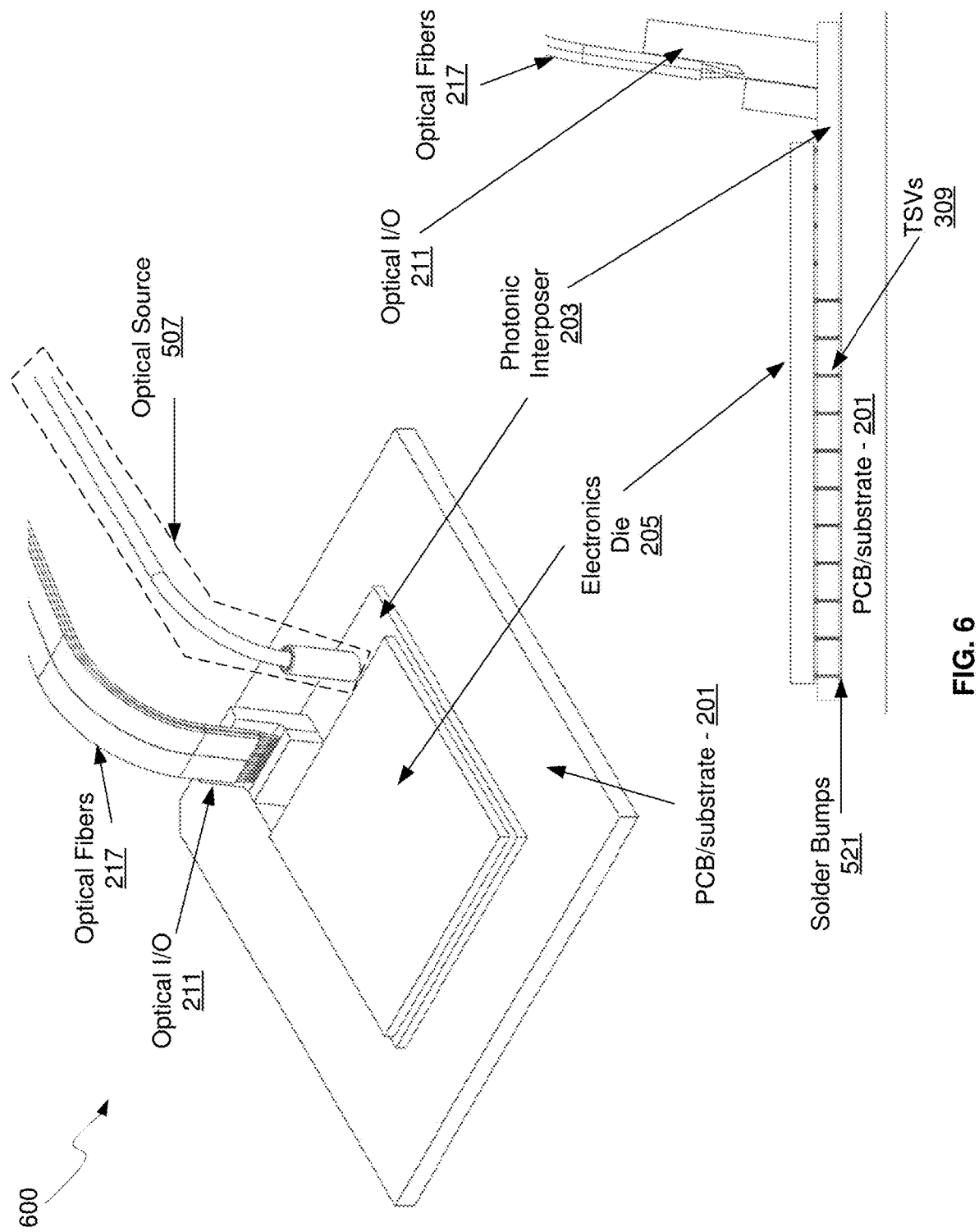
FIG. 6 is a diagram illustrating an exemplary photonic interposer with a single switch core, in accordance with an embodiment of the invention

FIG. 6 is a diagram illustrating an exemplary photonic interposer with a single switch core, in accordance with an embodiment of the invention. Referring to FIG. 6, there is shown a single-core photonic interposer switch 600 comprising the PCB/substrate 201, the silicon photonic interposer 203, electronics die 205, the optical I/O 211, the optical fibers 217, TSVs 309, and the optical source 507.

In an exemplary scenario, the single electronics die 205 may comprise a router, switch, and/or processor core for processing electrical signals, and may be heatsinked through the backside of the chip. The single-core photonic interposer switch 600 may receive a CW optical signal from the optical source fibers 507. Electrical signals generated in the electronics die 205 may be utilized to drive one or more modulators in the silicon photonic interposer 203. The one or more modulators may generate a digital optical signal for communicating data throughout the silicon photonic interposer 203, with the signals either being communicated out of the single-core photonic interposer switch 600 via the optical fibers 217 or to other parts of the electronics die 205.

By integrating all photonic devices in the silicon photonic interposer 203 and all electronic devices in the electronics die 205, the devices may be independently optimized in dedicated CMOS processes. In this manner, the CMOS interposer 203 may be configured for optimum photonic performance independent of the electronics die technology node. Similarly, by communicating signals optically via the silicon photonic interposer 203, there is no need for controlled impedance lines for communicating electronic signals. In addition, by configuring driver circuits directly above the associated photonic devices when hybridized, speed performance and power efficiency may be greatly increased.

Figure 7:
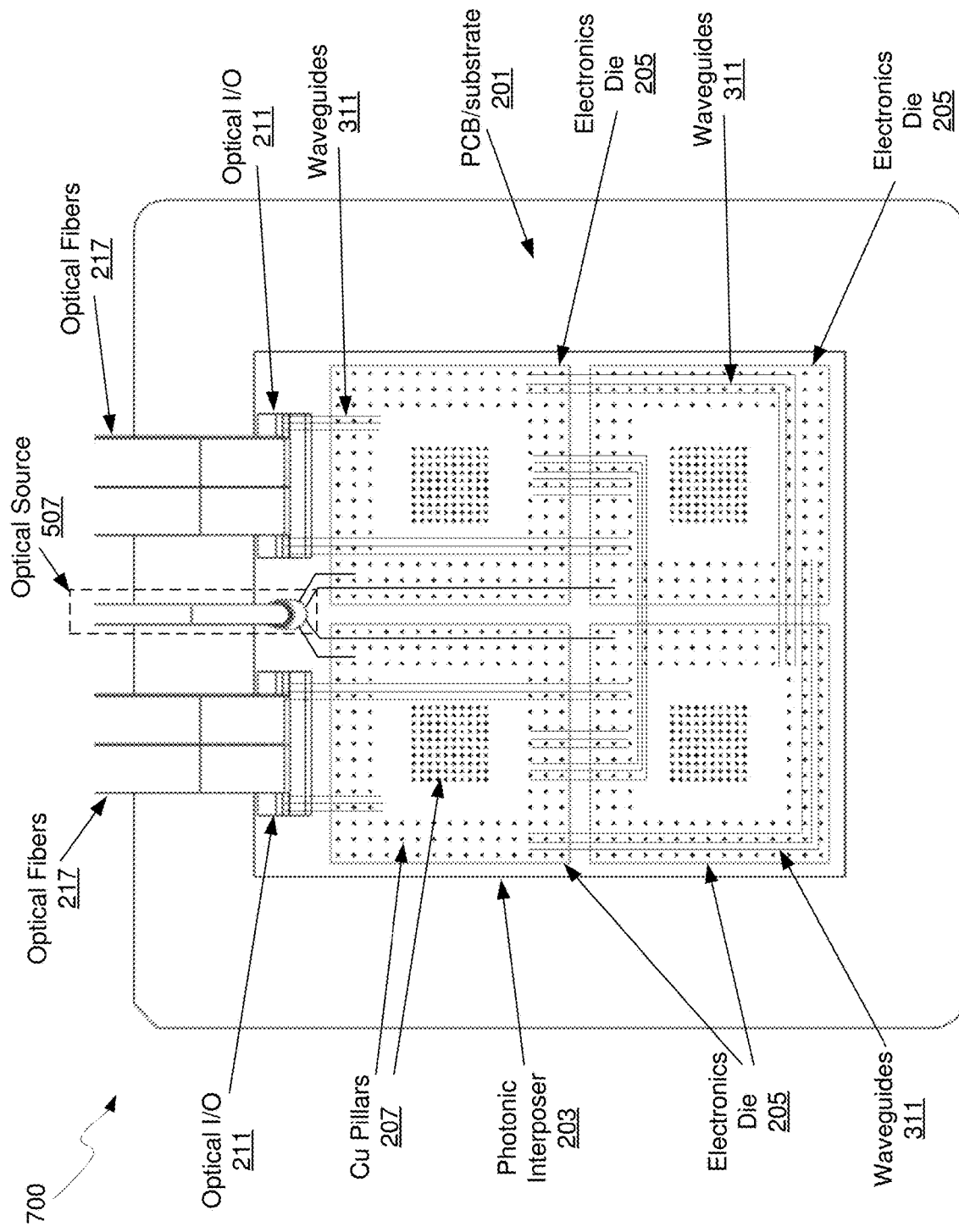
FIG. 7 is a diagram illustrating a photonic interposer with multi-core interconnects and waveguides, in accordance with an embodiment of the invention.

FIG. 7 is a diagram illustrating a photonic interposer with multi-core interconnects and waveguides, in accordance with an embodiment of the invention. Referring to FIG. 7, there is shown a multi-core interposer 700 comprising the PCB/substrate 201, the CMOS photonics interposer 203, the electronics die 205, copper pillars 207, optical I/Os 211, optical fibers 217, optical waveguides 311, and the optical source 507.

FIG. 7 shows a transparent view of the silicon photonic interposer 203 and the electronics die 205 to illustrate the waveguides 311 and the copper pillars 207. For example, sets of optical waveguides 311 are shown coupling the optical I/Os 211 to specific regions of the silicon photonic interposer 203, such that electrical signals may then be communicated to/from the electronics die 205 in those regions. Similarly, the optical waveguides 311 couple the optical source 507 to regions of the silicon photonic interposer 203 for subsequent modulation by modulators located under associated circuitry in the electronics die 205, thereby distributing the optical source signal throughout the CMOS optical interposer 203 for use by each of the electronics die 205 when converted to electrical signals, such as by photodiodes, for example.

The copper pillars 207 may be arranged around the perimeter of the electronics die 205 and/or centered on the die, as shown in FIG. 7. Similarly, TSVs may be placed throughout the silicon photonic interposer for providing electrical contact between devices in the electronics die 205 and the PCB/substrate 201. Accordingly, TSVs are integrated below some of the copper pillars 207.

Due to the very high bandwidth capability of single-mode optical communication, the multi-core interposer 700 may be capable of communicating at over 1 terabit per second. For example, utilizing ~20 micron Cu pillars with <20 fF capacitance, speeds of 50 GHz and higher can be achieved. Thus, by integrating a plurality of signals in the waveguides 311 and subsequently the optical fibers 217, terabits speeds are enabled.

Figure 8:
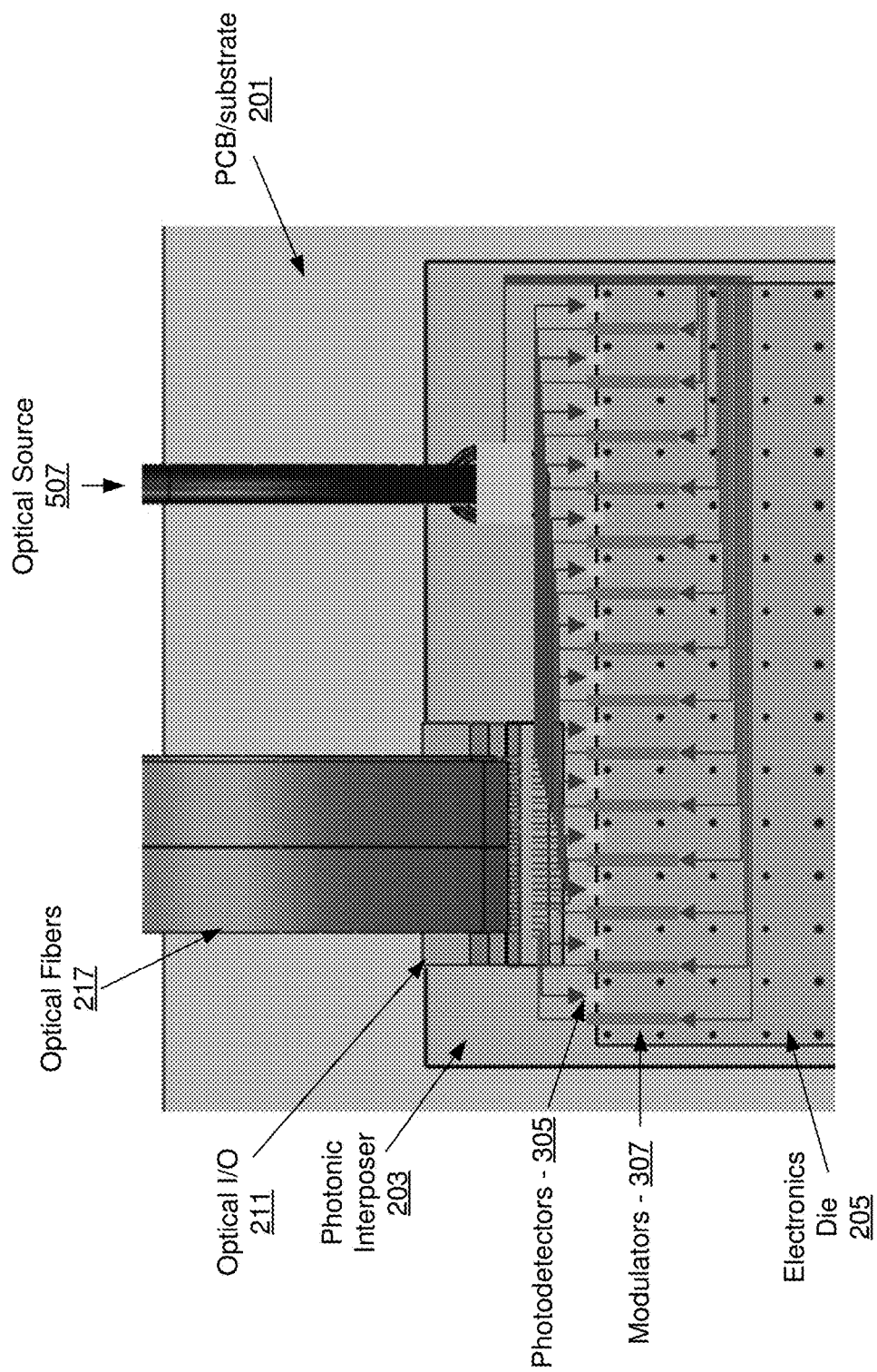
FIG. 8 is a diagram illustrating a photonic interposer with multi-core interconnects and waveguides, in accordance with an embodiment of the invention.

FIG. 8 is a diagram illustrating a photonic interposer with multi-core interconnects and waveguides, in accordance with an embodiment of the invention. Referring to FIG. 8, there is shown the PCB/substrate 201, the silicon photonic interposer 203, electronics die 205, optical I/O 211, optical fibers 217, photodetectors 305, modulators 307, and an optical source 507.

The photodetectors 305 and the modulators 307 may be organized in pairs in the silicon photonic interposer 203 to provide a two-way communication at the optical I/O 211, such that incoming optical signals from the optical fibers 217 may be converted to electrical signals by one or more of the photodetectors 305 for communication via a copper pillar to the electronics die 205. Similarly, electrical signals may be communicated from the electronics die 205 to one or more modulators 307 in the silicon photonic interposer 203 for conversion to an optical signal, which may be communicated via optical waveguides to the optical I/O 211 and subsequently out one or more of the optical fibers 217.

In addition, a CW optical signal from the optical source 507 may be communicated into the silicon photonic interposer 203 via one or more grating couplers and distributed throughout the interposer for subsequent processing by the modulators 307 that are driven by electronic circuits in the electronics die 205.

In an embodiment of the invention, a method and system are disclosed for a photonic interposer. In this regard, aspects of the invention may comprise receiving one or more continuous wave (CW) optical signals 101 in a silicon photonic interposer 203 from an optical source 209, 507 external to the silicon photonic interposer 203. The received CW optical signals 101 may be processed based on electrical signals received from the one or more CMOS electronics die 205. The modulated optical signals, Optical Signals In, may be received in the silicon photonic interposer 203 from one or more optical fibers 217 coupled to the silicon photonic interposer 203.

Electrical signals may be generated in the silicon photonic interposer 203 based on the received modulated optical signals, Optical Signals In. The generated electrical signals may be communicated to the one or more CMOS electronics die 205. The generated electrical signals may be communicated to the one or more CMOS electronics die 205 via copper pillars 207. The one or more CW optical signals may be received in the silicon photonic interposer from an optical source assembly coupled to the silicon photonic interposer. The one or more CW optical signals 101 may be received from one or more optical fibers 217 coupled to the silicon photonic interposer 203.

The one or more received CW optical signals 101 may be processed utilizing one or more optical modulators 105A-105D, 307 in the silicon photonic interposer. The one or more optical modulators 105A-105D, 307 may comprise Mach-Zehnder interferometer modulators, for example. The electrical signals may be generated in the silicon photonic interposer 203 utilizing one or more photodetectors 111A-111D, 305 integrated in the silicon photonic interposer 203. Optical signals may be communicated into, Optical Signals In, and/or out, Optical Signals Out, of the silicon photonic interposer 203 utilizing grating couplers 117A-117H, 301, 303. The one or more electronics die 205 may comprise one or more of: a processor core, a switch core, or router. The integrated optical communication system 100 comprises a plurality of transceivers 105/112/117/107/111 (A-F).

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
   receiving a continuous wave (CW) optical signal in a photonic interposer;
   generating a first modulated optical signal in the photonic interposer by processing the CW optical signal based on a first electrical signal received from a complementary metal-oxide semiconductor (CMOS) electronics die;
   communicating the first modulated optical signal out of the photonic interposer via a first optical fiber;
   receiving a second modulated optical signal via a second optical fiber; and
   generating a second electrical signal in the photonic interposer based on the second modulated optical signal.

2. The method according to claim 1, further comprising communicating the second electrical signal to the CMOS electronics die via copper pillars.

3. The method according to claim 1, further comprising generating the CW optical signal in an optical source assembly on the photonic interposer.

4. The method according to claim 3, wherein the optical source assembly further comprises a semiconductor laser.

5. The method according to claim 1, further comprising processing the CW optical signal via an optical modulator in the photonic interposer.

6. The method according to claim 5, wherein the optical modulator further comprises a Mach-Zehnder interferometer modulator.

7. The method according to claim 1, further comprising generating the second electrical signal in the photonic interposer via a photodetector integrated in the photonic interposer.

8. The method according to claim 1, further comprising receiving the second modulated optical signal via grating couplers integrated in the photonic interposer.

9. The method according to claim 1, wherein the electronics die further comprises a processor core, a switch core, memory, or a router.

10. An integrated optical communication system comprising a complementary metal-oxide semiconductor (CMOS) electronics die coupled to a photonic interposer, the integrated optical communication system being operable to:
    receive a continuous wave (CW) optical signal in the photonic interposer;
    generate a first modulated optical signal by processing the CW optical signal based on a first electrical signal received from the CMOS electronics die;
    communicate the first modulated optical signal out of the photonic interposer via a first optical fiber;
    receive a second modulated optical signal via a second optical fiber; and
    generate a second electrical signal in the photonic interposer based on the second modulated optical signal.

11. The system according to claim 10, wherein the integrated optical communication system is further operable to communicate the second electrical signal to the CMOS electronics die via copper pillars.

12. The system according to claim 10, wherein the integrated optical communication system is further operable to generate the CW optical signal in an optical source assembly on the photonic interposer.

13. The system according to claim 12, wherein the optical source assembly further comprises a semiconductor laser.

14. The system according to claim 10, wherein the integrated optical communication system is further operable to process the CW optical signal via an optical modulator in the photonic interposer.

15. The system according to claim 14, wherein the optical modulator further comprises a Mach-Zehnder interferometer modulator.

16. The system according to claim 10, wherein the integrated optical communication system is further operable to generate the second electrical signal in the photonic interposer via a photodetector integrated in the photonic interposer.

17. The system according to claim 10, wherein the integrated optical communication system is further operable to receive the CW optical signal via grating couplers integrated in the photonic interposer.

18. The system according to claim 10, wherein the electronics die further comprises a processor core, a switch core, memory, or a router.

19. A system for communication, the system comprising:
an integrated optical communication system comprising a complementary metal-oxide semiconductor (CMOS) electronics die coupled to a photonic interposer, the integrated optical communication system being operable to:
receive a continuous wave (CW) optical signal in the photonics die from an optical source on the photonic interposer;
generate a first modulated optical signal by modulating the CW optical signal based on a first electrical signal received from the CMOS electronics die;
communicate the first modulated optical signal out of the photonic interposer via a first optical fiber;
receive a second modulated optical signal via a second optical fiber; and
generate a second electrical signal in the photonic interposer based on the second modulated optical signal.

* * * * *